United States Patent [19]
Trinh et al.

[11] Patent Number: 5,371,473
[45] Date of Patent: Dec. 6, 1994

[54] THERMALLY STABLE ALC FOR PULSED OUTPUT AMPLIFIER

[75] Inventors: Lanh T. Trinh, Carlsbad; Erwin G. Vigilia, San Diego, both of Calif.

[73] Assignee: Hughes Aircraft Company, Los Angeles, Calif.

[21] Appl. No.: 119,911

[22] Filed: Sep. 10, 1993

[51] Int. Cl.$^5$ .......................................... H03G 3/20
[52] U.S. Cl. ................................. 330/129; 330/141
[58] Field of Search ............ 330/129, 131, 141, 149, 330/281, 284; 455/126

[56] References Cited

U.S. PATENT DOCUMENTS 5,054,116 10/1991 Davidson ..................... 455/126
5,081,713 1/1992 Miyazaki ..................... 455/126 X
5,128,629 7/1992 Trinh ............................... 330/129

Primary Examiner—Steven Mottola
Attorney, Agent, or Firm—Phyllis Y. Price; William J. Streeter; Wanda K. Denson-Low

[57] ABSTRACT

A method and apparatus incorporating a single self-compensating diode power detector in the feedback loop of a pulsed amplifier for exploiting the discontinuous nature of the pulsed amplifier to extract any thermally induced error voltage by a single power detector between the transmission bursts and use it to correct the power detector voltage during the bursts to obtain a true power indicative voltage, independent of temperature variation.

9 Claims, 5 Drawing Sheets

THERMALLY STABLE ALC FOR PULSED OUTPUT AMPLIFIER

BACKGROUND OF THE INVENTION

1. Field of the Invention

The present invention generally relates to transmitters for communication systems and, more particularly, to an Automatic Level Control (ALC) circuit for transmitter amplifiers in a burst communications system, such as Time-Division-Duplex (TDD) or Time-Division-Multiple-Access (TDMA) to control the power level to a specified tolerance regardless of ambient temperature variation.

2. Description of the Prior Art

With the rapid increase in users of mobile communications, the Federal Communications Commission (FCC) assigns frequency channels and controls broadcast power levels to help alleviate overcrowded conditions. The control of output power from cellular and personal communications systems must be very carefully monitored to comply with FCC regulations. A major problem encountered in complying with the output power regulations is controlling voltage fluctuations induced by temperature variations in the components of the power amplifier.

Conventional techniques for temperature stable ALC involves the use of a dual diode power scheme wherein the voltage variation due to the temperature of the detector diode is compensated for by a similar variation in a second diode placed in thermal proximity of the detector diode. As the ambient temperature changes, a corresponding voltage drop across the principle diode detector will result in a change in the detected voltage, an equal and opposite change will develop in the secondary diode's voltage drop to correct the temperature induced change in the principle detectors voltage. The net voltage from the dual diode detector is thus largely independent of the temperature effect. The dual diode temperature compensation technique requires that the diode pair be precisely matched to obtain good results. Often the diode pair has to be hand selected for proper matching making this technique expensive to implement. Even then,dissimilar characteristics still exist between the two closely matched diodes to render the dual diode technique inferior.

SUMMARY OF THE INVENTION

It is therefore an object of the present invention to provide a thermally stable automatic level control circuit for a pulsed output amplifier in a burst communication system which does not require a matched diode pair.

According to the invention, a single "self-compensating" diode power detector is used in the feedback circuit of a burst mode power amplifier. The diode's temperature dependent voltage is extracted during the "off" state of a burst mode amplifier and the information is used for correcting the detection voltage during the amplifier "on" state.

This invention essentially consists of ALC technique for transmitter amplifiers in burst communication systems such as TDD (Time-Division-Duplex) or TDMA (Time-Division-Multiple-Access). Transmitter amplifiers found in these digital systems are normally required to hold one of a plurality of output power levels to a specified tolerance regardless of the ambient temperature variation. These systems, whether for satellite or land mobile applications are such that transmissions are sent in short carrier bursts rather than continuously. The remaining time is used for receive functions during which the transmitting amplifier is normally shut off. The disclosed invention exploits the discontinuous nature of this type of transmission to extract the thermally borne voltage of the power detector between the transmission burst and uses it to correct the power detector voltage during the bursts to obtain a true power indicative voltage, independent of temperature variation. This technique uses only one diode for power detection, yet provides precise thermal tracking and avoids the need for a second matched diode. The disclosed ALC loop comprises in addition to the basic ALC loop, a sample and hold circuit and a voltage subtracting circuit. When the amplifier is idled between bursts, the thermally induced detector voltage is sampled and held by a sample and hold circuit. When the amplifier transmits a carrier burst, the previously held thermally induced voltage is subtracted from the total detector voltage to provide a true power indicative voltage. This power indicative voltage is compared against a set point voltage in a voltage comparator, the error voltage from the comparator is used for setting the gain of a variable gain circuit so that the output power is set to a desired level. During the subsequent carrier idle periods, the idle detector voltage is again sampled and stored for subtraction from the total detection voltage during the following carrier on bursts and the resultant voltage is used for closed loop controlling of the amplifier gain. This process continues for the duration of the transmission.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
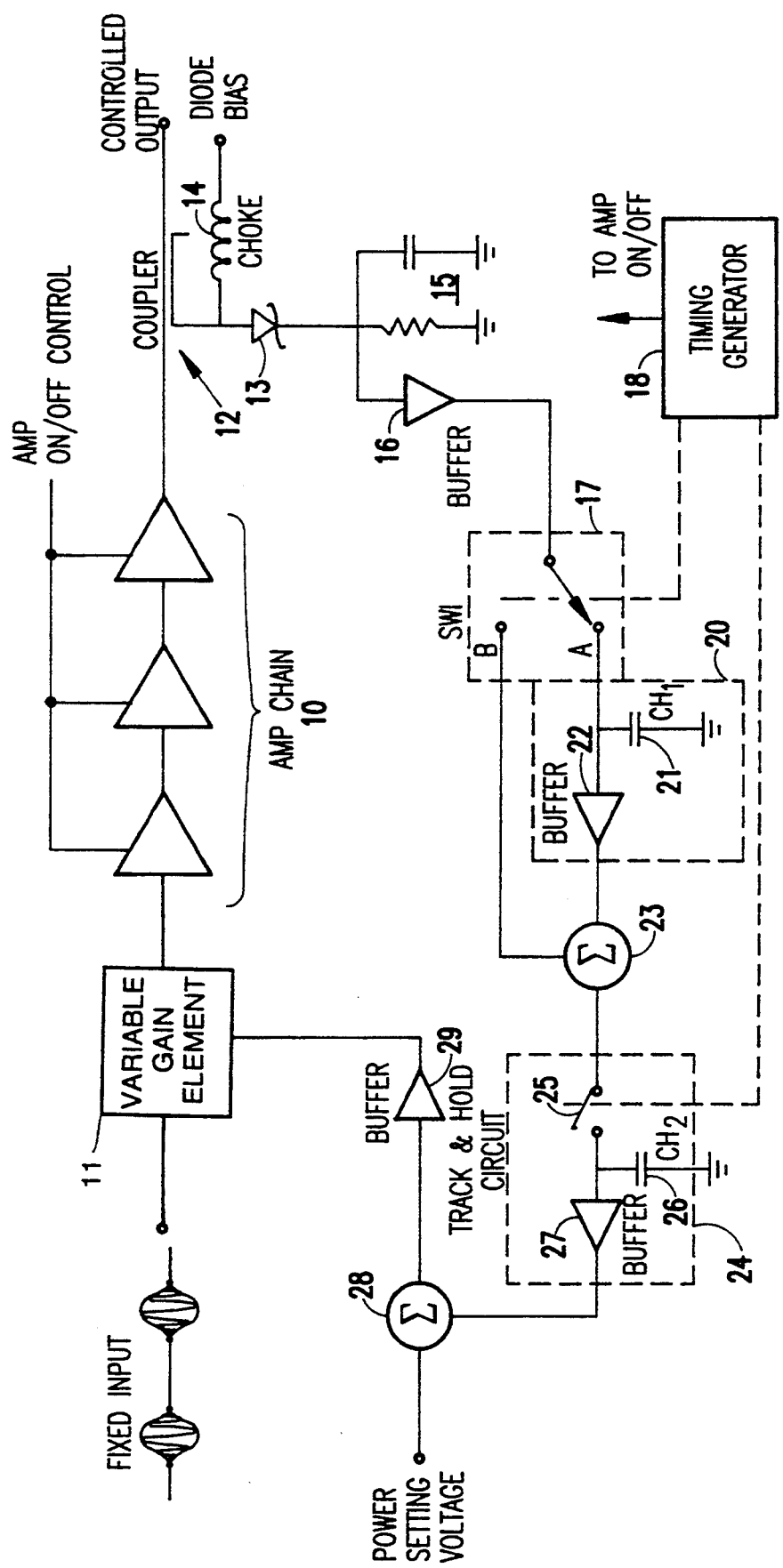
FIG. 1 is a block diagram of the instant invention using a single self-compensating diode power detector in the feedback loop to compensate for any thermally induced error voltages in the power amplifier.

Referring now to the drawings, and more particularly to FIG. 1, there is shown a block diagram of the first embodiment of the invention. The amplifier chain 10 receives its input from a variable gain element 11 (which variable gain element could be an adjustable attenuator or, alternatively, a variable gain preamplifier), and the output of the amplifier chain 10 is sampled by directional coupler 12 and detected by Schottky diode 13. The diode 13 is provided with a bias voltage via an RF (radio frequency) choke 14 connected to the anode of the diode, while the cathode of the diode is connected to an RC (resistor/capacitor) filter 15 to generate a detected DC voltage.

The detected DC voltage is supplied via an isolation buffer amplifier 16 to an electronic switch 17, here represented as a SPDT (single-pole, double-throw) switch having two outputs denoted as A and B. Electronic switch 17 is controlled by a timing generator 18 which also controls the on/off operation of the amplifier chain 10. The A output of switch 17 is supplied to a sample-and-hold (S/H) circuit 20 comprising a capacitor 21 and a high input impedance buffer amplifier 22 in combination with the switch 17. The output of the S/H circuit 20 is supplied to the negative input of a summing junction 23. The B output of switch 17 is supplied directly to the positive input of the summing junction 23.

The output of the summing junction 23 is input to a track-and-hold (T/H) circuit 24 comprising a second electronic switch 25, a second capacitor 26 and a third buffer amplifier 27. The second electronic switch 25 is also controlled by the timing generator 18. The output of the T/H circuit 24 is input to a comparator 28 that receives a power setting voltage as its second input. The output of comparator 28 is supplied to a fourth buffer amplifier 29 that drives variable gain element 11.

Figure 2A:
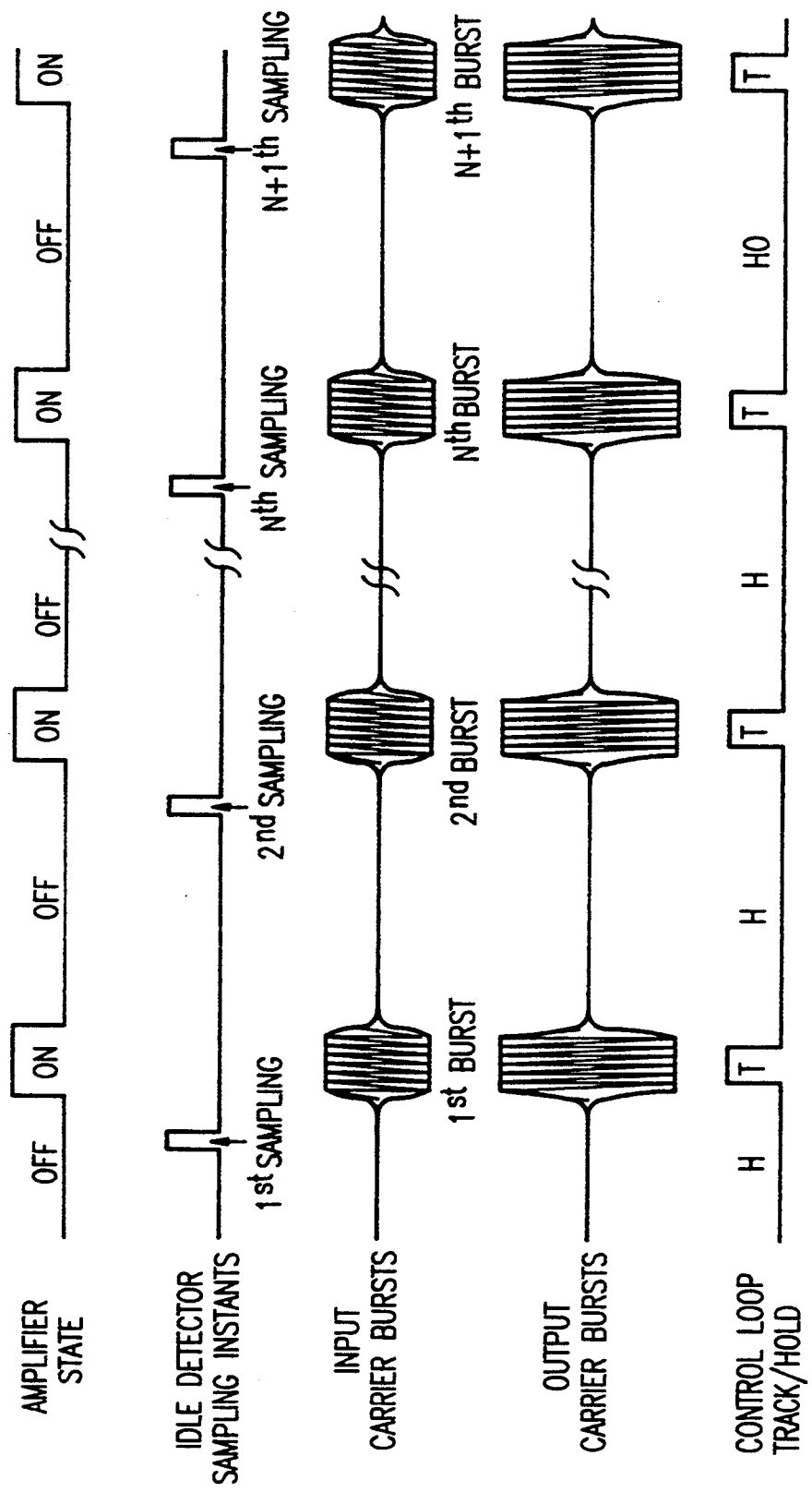
FIGS. 2A and 2B are timing diagrams showing the sequence of events during the operation of the circuit shown in FIG. 1, FIG. 2B being an enlargement of a single burst's sequence of events.
Figure 2B:
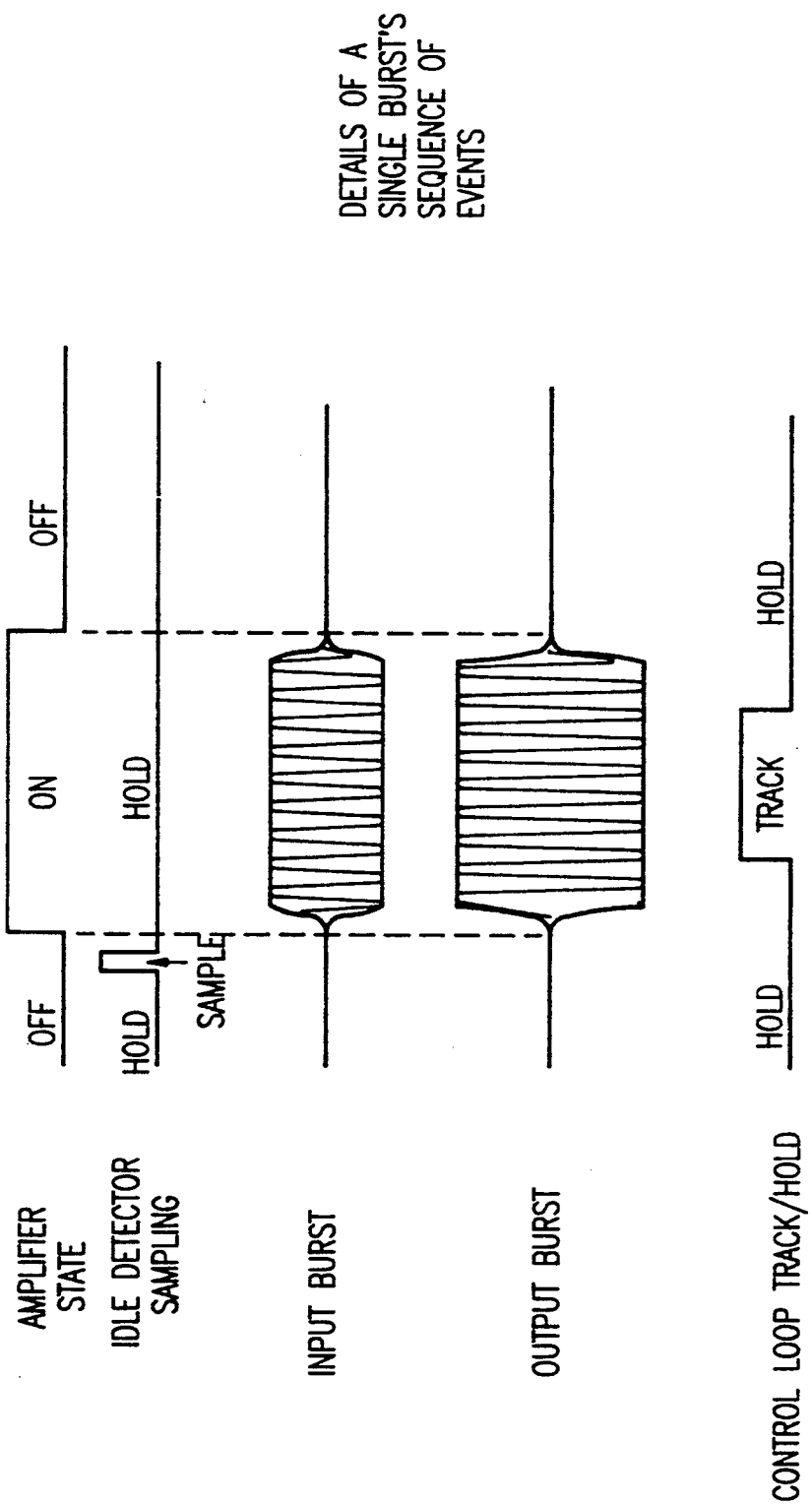

This invention can best be understood by referring to FIGS. 1, 2A and 2B simultaneously. The circuit shown in FIG. 1 operates as follows. Just before the first carrier burst is transmitted, the electronic switch 17 is momentarily turned to position A and the detector's voltage is sampled and stored in hold capacitor 21, as indicated by the second lines of timing diagrams of FIGS. 2A and 2B. This voltage is a function of the DC voltage drop across the detector diode 13 and varies as a function of the ambient temperature. The switch 17 is then returned to position B before the first carrier burst is transmitted. The amplifier chain 10 is then turned on to transmit a carrier burst as indicated by the first lines of FIGS. 2A and 2B. The input burst, shown on the third lines of FIGS. 2A and 2B, is amplified to produce the output burst shown on the fourth lines of FIGS. 2A and 2B.

During the burst, the detector 13 bears a combination of the thermally induced diode voltage (previously sampled and stored on capacitor 21 ) and the carrier power induced voltage. The carrier induced voltage is a DC voltage that results from rectification of the carrier (AC) to a DC voltage by the detector diode 13. The high impedance buffer amplifier 22 follows the hold capacitor 21 to prevent its charge from leaking during the hold time. Next, the summer 23 subtracts the thermally induced voltage from the combination voltage, leaving only the true carrier power borne voltage. This is the feedback voltage to be compared against the power setting voltage in the voltage comparator circuit 28. The output voltage of the comparator 28 represents the ALC loop error voltage and is used to control the variable gain element 11 (or, alternatively, a variable gain preamplifier) such that the feedback voltage will equal the power setting voltage according to the negative feedback control principle. As such, the amplifier system is set to the correct output power during the carrier burst.

During the next idle time of the carrier, the diode detector idle voltage is again sampled and held in the capacitor 21 to be subsequently subtracted from the total detection voltage during the following carrier burst. Since it will take the ALC loop a finite amount of time at the beginning of each burst for the loop to reach the closed loop condition with a near zero loop error, the T/H circuit 24 is used to maintain the detector's voltage just prior to the transition from the on state of the off state of one burst, as indicated on the fifth lines of FIGS. 2A and 2B. This voltage is held until the next burst for setting the amplifier chain's gain of at the beginning of the burst, thus allowing the burst envelope's rise and fall profiles to follow the input drive. The power leveling is only done at the center of the burst. This concept of track-and-hold switching offset from the beginning and the end of each burst is described in greater detail in U.S. Pat. No. 5,128,629 to Lanh T. Trinh.

If the ambient temperature varies, the idle diode voltage will vary accordingly, at the rate of about 2 mV/° C. for Schottky diodes. The combined detection voltage will also vary accordingly, but the corrected detection voltage will stay substantially constant for a given operating output power. A constant detection voltage over temperature results in constant output power over temperature by means of closed loop control.

Figure 3:
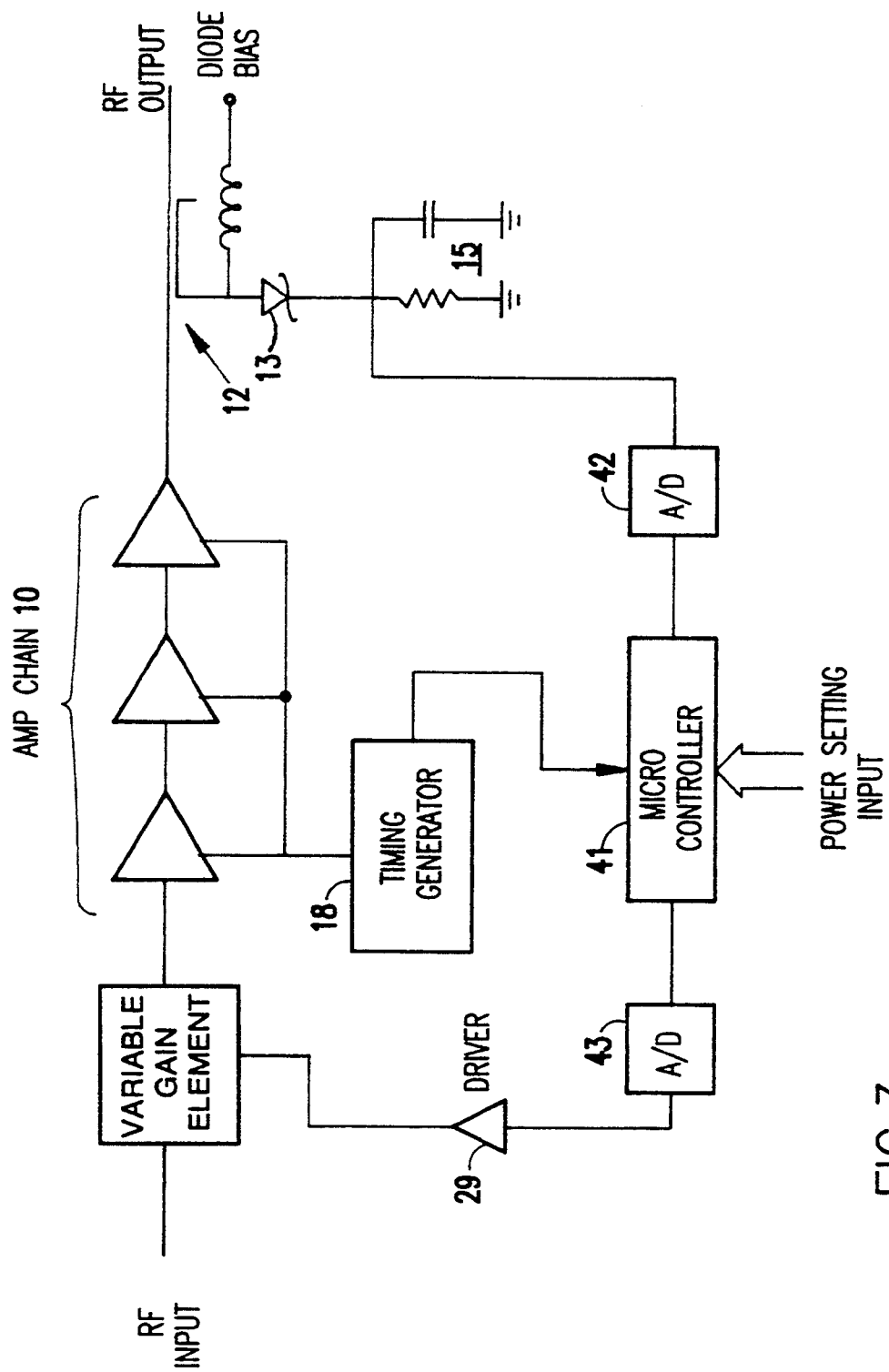
FIG. 3 shows a digital embodiment of the same circuit as shown in FIG. 1.

An alternate digital implementation of the same invention is shown in FIG. 3. In this embodiment, a microcontroller 41, including digital memory, supporting registers and control firmware, receives as an input the power setting point control input and operates to control the power of amplifier chain 10. Here, the use of digital memory in the microcontroller implementation replaces the analog memories associated with S/H and T/H circuits of the embodiment shown in FIG. 1. And rather than directing controlling electronic switches in the S/H and T/H circuits, the timing generator 18 provides timing signals to the microcontroller 41. The diode detector voltage is digitized by an analog-to-digital (A/D) converter 42. The analog values are converted to binary values that will be processed by the microcontroller 41 in a similar fashion as the analog embodiment counterpart. After processing a proportional control algorithm, the logic of which is shown in FIG. 4, the control value is output to a digital-to-analog (D/A) converter 43 for driving the variable gain element 11 to achieve the desired output power setting.

Figure 4:
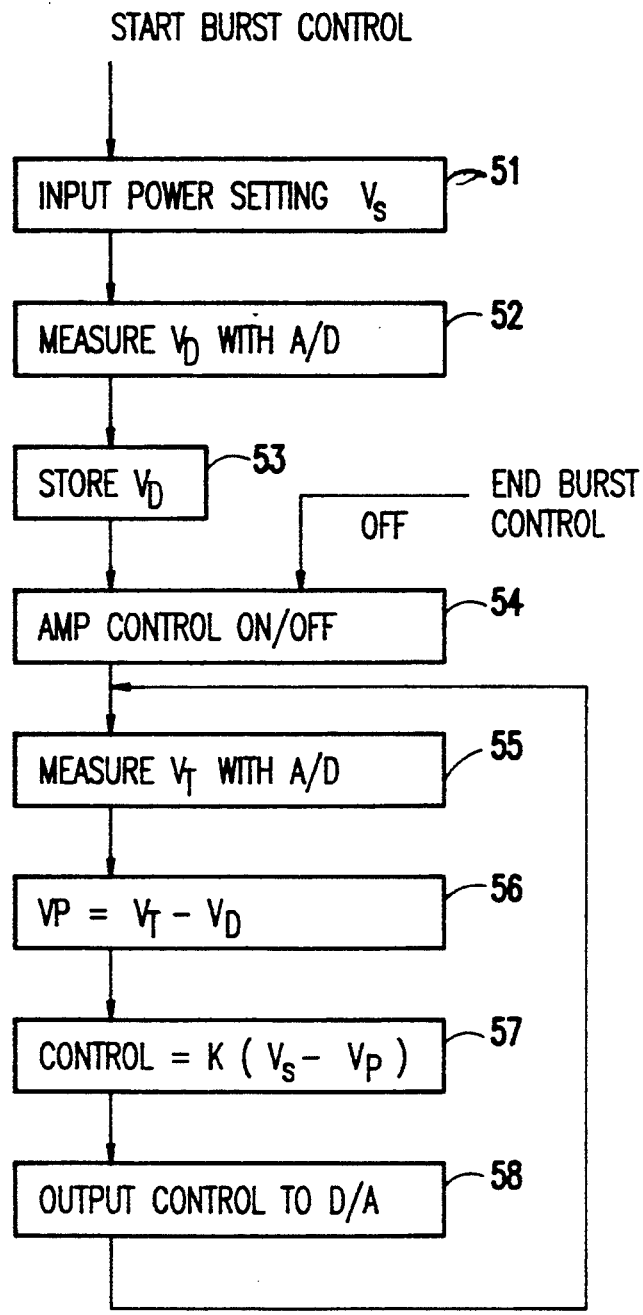
FIG. 4 is a flow chart showing the logic of the control program implemented on the microcontroller shown in the FIG. 3 embodiment.

With reference to FIG. 4, the operation of the digital version is substantially similar to the analog counterpart. In response to a start burst control from the timing generator 18, the microcontroller 41 first reads the input power setting $V_S$, as indicated in function block 41. Then, before the first burst is transmitted, the microcontroller 41 measures the diode's idle voltage $V_D$ by means of the A/D converter 42, as indicated in function block 52, and stores the digital word in a register, as indicated in function block 53. This value represents the thermally induced diode information. The microcontroller 41 then generates a control signal that approximately sets the gain of the amplifier chain 10 in function block 54.

The amplifier chain 10 is next turned on by the timing generator 18 to transmit the first burst. The A/D converter 42 now reads the combined detection voltage, or the true carrier power borne voltage, $V_T$, offset by the thermally induced voltage, as indicated in function block 55. The previously stored diode thermally borne value, $V_D$, is then digitally subtracted from the combined value, $V_T$, by microcontroller 41 leaving only the true carrier borne detection dam, $V_P$, as indicated in function block 56. This subtraction is done continuously during the burst time. The true carrier borne detection data is used for closed loop control as the feedback data compared against set point data, $V_S$, representing the desired output power level, using a proportional control algorithm in function block 57. The algorithm continuously computes the value $k \times (V_S - V_P)$ and outputs this value to the D/A converter 43 where it is converted to a control voltage used for setting the gain of a variable attenuator or a gain control amplifier so that the output power is controlled to the correct output level.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. In a burst mode transmitter amplifier which transmits in short carrier bursts, an automatic level control feedback circuit for maintaining one of a plurality of selectable output power levels of a burst mode amplifier to a specified tolerance, regardless of ambient temperature variation of the circuit, said automatic level control feedback circuit comprising:
   a power detector diode coupled to an output of the burst mode amplifier;
   sampling means for sampling a power level at the power detector diode, between transmission bursts, to determine a level of thermally induced error voltage across the detector diode;
   a voltage holding circuit for holding a sampled voltage output by the sampling means, the sampled voltage being a thermally induced detector voltage between transmission bursts;
   voltage subtracting means for subtracting the thermally induced detector voltage held by said voltage holding circuit from a total detector voltage during a carrier burst period to provide as an output voltage a resultant true power indicative voltage; and
   a voltage comparator means for comparing the output voltage of the subtracting means with a set point voltage for obtaining an error voltage for setting a gain of a variable gain element such that an output power of the burst mode amplifier is set to a desired level.

2. The automatic control circuit of claim 1, wherein an on-off cycle of the burst mode amplifier and sampling means are controlled by a single timing generator means.

3. The automatic level control circuit of claim 1, wherein the variable gain element is connected between an input of the burst mode amplifier and a signal source.

4. The automatic level control circuit of claim 3, wherein the variable gain element is a variable attenuator.

5. The automatic level control circuit of claim 3, wherein the variable gain element is a variable gain preamplifier.

6. The automatic level control circuit of claim 1, wherein a track and hold circuit is coupled to receive the output of the voltage subtracting means for holding the resultant true power indicative voltage between bursts for setting a gain of the burst mode amplifier for each following burst, thus allowing an envelope of the burst to have rise and fall profiles that follow an input signal.

7. The automatic level control circuit of claim 1, wherein the voltage subtracting means and the voltage comparator means are implemented with a microcontroller and said sampling means is implemented with an analog-to-digital converter, said analog-to-digital converter converting said thermally induced detector voltage to a first digital value which is stored in a first register within the microcontroller, said analog-to-digital converter also converting the resultant true power indicative voltage to a second digital value which is stored in a second register within the microcontroller, said microcontroller subtracting the digital values stored in the first and second registers and comparing the difference against set point data representing a desired output power level to generate an error value, said automatic level control circuit further comprising a digital-to-analog converter connected to receive said error value and generate a control voltage for setting the gain of the variable gain element.

8. In a burst mode transmitter amplifier which transmits in short carrier bursts, a method for maintaining one of a plurality of selectable output power levels of a burst mode amplifier to a specified tolerance, regardless of ambient temperature variation of the circuit, said method comprising the steps of:
   sampling a power level at a power detector diode coupled to an output of the burst mode amplifier, between transmission bursts, to determine a level of thermally induced error voltage across the detector diode:
   holding a sampled voltage which is a thermally induced detector voltage between transmission bursts;
   subtracting the thermally induced detector voltage from a total detector voltage during a carrier burst period to provide as an output voltage a resultant true power indicative voltage; and
   comparing the output voltage of the subtracting step with a set point voltage to obtain an error voltage for setting a gain of a variable gain element such that an output power of the burst mode amplifier is set to a desired level.

9. The method of claim 8, further comprising the step of holding the resultant true power indicative voltage between bursts for setting a gain of the burst mode amplifier for each following burst, thus allowing an envelope of the burst to have rise and fall profiles that follow an input signal.

* * * * *